United States Patent
Webster et al.

(10) Patent No.: US 7,540,672 B2
(45) Date of Patent: Jun. 2, 2009

(54) DIGITAL STILL CAMERA MODULE

(75) Inventors: Steven Webster, Miao-li (TW);
Ying-Cheng Wu, Miao-li (TW);
Kun-Hsieh Liu, Miao-li (TW); Po-Chih Hsu, Miao-li (TW)

(73) Assignee: Altus Technology Inc., Chu-Nan, Miao-Li Hsien (TW)

( * ) Notice: Subject to any disclaimer, the term of this patent is extended or adjusted under 35 U.S.C. 154(b) by 396 days.

(21) Appl. No.: 11/262,592

(22) Filed: Oct. 31, 2005

(65) Prior Publication Data
US 2006/0093352 A1 May 4, 2006

(30) Foreign Application Priority Data
Oct. 29, 2004 (TW) ............... 93132937 A

(51) Int. Cl.
*G03B 17/00* (2006.01)
(52) U.S. Cl. ..................... 396/529; 348/340
(58) Field of Classification Search ............... 250/200; 396/529; 348/340
See application file for complete search history.

(56) References Cited

U.S. PATENT DOCUMENTS

| | | | |
|---|---|---|---|
| 5,847,929 A * | 12/1998 | Bernier et al. ............... 361/719 |
| 6,150,074 A * | 11/2000 | Shimoto et al. ............. 430/314 |
| 7,112,864 B2 * | 9/2006 | Tsukamoto et al. .......... 257/433 |
| 2004/0149885 A1* | 8/2004 | Shiau ...................... 250/208.1 |
| 2004/0150740 A1* | 8/2004 | Hsin ......................... 348/340 |

FOREIGN PATENT DOCUMENTS

CN 01200427.8 10/2001

* cited by examiner

*Primary Examiner*—Patrick J Assouad
*Assistant Examiner*—Autumn Parker

(57) ABSTRACT

A digital still camera module includes an image sensor package (2) and a lens barrel (30) mounted on the image sensor package. The image sensor package includes a substrate (20), an image sensor chip (22), and a cover (28). The substrate defines a receiving chamber (203) therein. The image sensor chip mounted in the receiving chamber of the substrate. The cover, which is transparent and has a smaller profile than that of the substrate, is secured to the top portion of the substrate thereby sealing the receiving chamber. The top portion of the substrate has an uncovered section (29) at a periphery of the cover. The lens barrel includes at least one lens (31) received therein. The lens barrel is securely attached to the uncovered section of the top portion of the substrate.

19 Claims, 1 Drawing Sheet

DIGITAL STILL CAMERA MODULE

FIELD OF THE INVENTION

The present invention relates generally to digital still camera modules, and more particularly to a small sized digital still camera module which provides high quality imaging and which is durable.

BACKGROUND

A digital image capturing system utilizes an image optic mechanism such as a lens module to form an image, and an image sensor to capture the image. Conventionally, in order to protect the image sensor from oxidation or contamination, the image sensor is sealed in a structural package. The lens module is set on the image sensor package, and directs imaging light to be projected onto the image sensor.

FIG. 1 illustrates a conventional digital still camera module 10. The camera module 10 is constructed to include an image senor package (not labeled), and a lens module 15 covering the image sensor package. The image sensor package includes a substrate 11, an image sensor chip 12, a plurality of bonding wires 13, an adhesive means 14, and a connecting device 16. The substrate 11 has a top side (not labeled), and defines a receiving chamber 110. The top side defines an opening in communication with the receiving chamber 110. The top side is provided with a plurality of connecting pads (not shown) arranged around the opening. The connecting device 16 includes a plurality of metal leads 16a. Each of the metal leads 16a has one end 16b electrically connected to the corresponding connecting pad at the top side of the substrate 11, and another end 16c extending to an exterior of the substrate 11 and bent into a predetermined shape. The image sensor chip 12 is mounted in the receiving chamber 110. The image sensor chip 12 is provided with a plurality of connecting pads respectively electrically connected to the connecting pads of the substrate 11 by means of the bonding wires 13. The adhesive means 14 is applied on areas where the bonding wires 13 connect with the connecting pads of the substrate 11. The lens module 15 defines a through hole 15a aligned with the image sensor chip 12, and includes at least one lens 15b mounted in the through hole 15a. The lens module 15 is fixed to the image sensor package by means of the adhesive means 14, thereby covering the opening of the top side of the substrate 11. In order to mount the camera module 10 onto a circuit board, tin solder is applied to the ends 16c of the metal leads 16. The image sensor chip 12 is thereby electrically connected to the circuit board.

For the camera module 10, it is generally difficult to predetermine and control the amount of adhesive means 14 to be applied between the lens module 15 and the substrate 11. If the adhesive means 14 is insufficient, the lens module 15 may not securely adhere to the substrate 11. Over a period of time, cracks or gaps may occur at the interface between the lens module 15 and the top side of the substrate 11. If this happens, moisture may infiltrate into the receiving chamber 110, thereby adversely affecting the performance of the image sensor chip 12. In addition, the lens module 15 is liable detach from the substrate 11. This may cause complete damage of the camera module 10. Furthermore, if the adhesive means 14 is overly applied, the excess adhesive means 14 is liable to overflow down along an outside wall of the substrate 11 to the bottom of the substrate 11. If this happens, the overflowing adhesive means 14 may form insulating coatings on the ends 16c of the metal leads 16. This may cause the substrate 11 to be unable to properly electrically connect with the circuit board. In either case of too little or too much adhesive means 14, the quality and/or reliability of the camera module 10 may be degraded.

Furthermore, during assembly of the camera module 10, it is difficult to ensure that the lens 15b is precisely aligned with a center of the image sensor chip 12 when mounting the lens module 15 onto the substrate 11. In general, a central part of an image projected on an image pickup surface of the image sensor chip 12 has a higher resolution, while a peripheral part of the image is generally somewhat distorted. In addition, only the central part of the image is generally picked up and presented in a viewfinder. In cases where the optical axis of the lens 15b is somehow displaced from the center of the image pickup surface of the image sensor chip 12, the distorted image will be projected onto the central part of the image pickup surface of the image sensor chip 12. If this happens, the presented image may have reduced quality.

What is needed, therefore, is a digital still camera module having high quality imaging and a reliable, durable structure.

SUMMARY

In a preferred embodiment, a digital still camera module includes an image sensor package and a lens barrel mounted on the image sensor package. The image sensor package includes a substrate, an image sensor chip, and a cover. The substrate defines a receiving chamber therein. The image sensor chip mounted in the receiving chamber of the substrate. The cover, which is transparent and has a smaller profile than that of the substrate, is secured to the top portion of the substrate thereby sealing the receiving chamber. The top portion of the substrate has an uncovered section at a periphery of the cover. The lens barrel includes at least one lens received therein. The lens barrel is securely attached to the uncovered section of the top portion of the substrate.

Other advantages and novel features will become more apparent from the following detailed description of preferred embodiments when taken in conjunction with the accompanying drawings, in which:

DETAILED DESCRIPTION OF THE PREFERRED EMBODIMENTS

Figure 1:
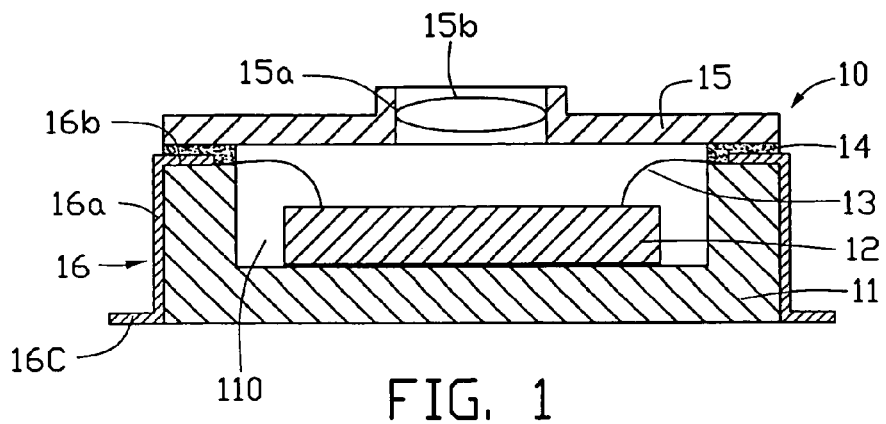
FIG. 1 is a simplified, schematic, cross-sectional view of a conventional digital still camera module.
Figure 2:
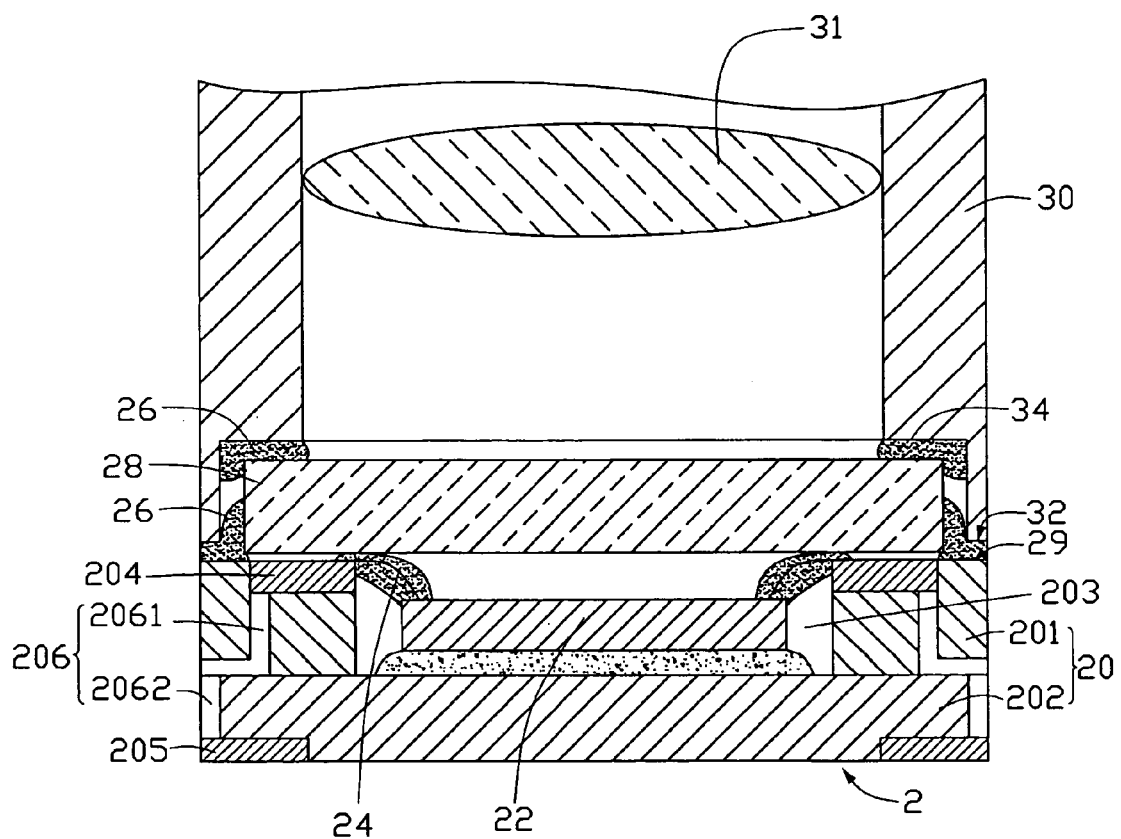
FIG. 2 is a simplified, schematic, cross-sectional view of a digital still camera module according to a preferred embodiment of the present invention.

Referring to FIG. 2, a digital still camera module in accordance with a preferred embodiment of the present invention is shown. The digital still camera module includes an image sensor package 2, and a lens barrel 30 which receives at least one lens 31 therein.

The image sensor package 2 includes a substrate 20, an image sensor chip 22, a plurality of bonding wires 24, an adhesive means 26, and a cover 28.

The substrate 20 is made of a material such as a ceramic material or a fibrous composite material. The substrate 20 includes a frame substrate 201 and a board substrate 202. The frame substrate 201 is fixedly mounted on a top surface of the board substrate 202 to form the substrate 20. The top surface of the board substrate 202 and an inner wall of the frame substrate 201 cooperatively define a receiving cavity 203 therebetween. The receiving cavity 203 includes an opening at a top surface of the substrate 20. The opening communicates with an outside, so that the receiving cavity 203 can receive an electronic component such as the image sensor chip 22. A plurality of top solder pads 204 are embedded in the top surface portion of the substrate 20. Each top solder pad 204 corresponds to a respective bottom solder pad 205 embedded in a bottom surface portion of the substrate 20. An outer end of each top solder pad 204 is spaced a certain distance from an outer surface of the substrate 20. The bottom solder pads 205 are used to electrically connect the substrate 20 with an electronic component such as a circuit board (not shown). A plurality of vias 206 are defined in the substrate 20 between the top solder pads 204 and the bottom solder pads 205. The vias 206 includes a plurality of top via portions 2061 defined in the frame substrate 201, and a plurality of bottom via portions 2062 defined in the board substrate 202. Each top via portion 2061 corresponds to and communicates with a respective bottom via portion 2062 when the frame substrate 201 is fixedly mounted on the board substrate 202. A top of each top via portion 2061 is covered by a respective top solder pad 204, and a bottom of each bottom via portion 2062 is covered by a respective bottom solder pad 205. Each via 206 is filled with or plated with a conductive material, in order to electrically connect the top solder pad 204 with the corresponding bottom solder pad 205. In the illustrated embodiment, each via 206 further includes a horizontal intermediate via portion (not labeled) interconnecting the top via portion 2061 with the bottom via portion 2062. The intermediate via portion is defined in a bottom surface portion of the frame substrate 201. Alternatively, the intermediate via portion can be defined in a top surface portion of the board substrate 202, or in both the bottom surface portion of the frame substrate 201 and the top surface portion of the board substrate 202. In the illustrated embodiment, each intermediate via portion comprises a termination at the outer wall of the substrate 20. Alternatively, each top via portion 2061 may be aligned with a corresponding bottom via portion 2062. That is, there are no intermediate via portions. This facilitates easy manufacturing of the substrate 20 with the vias 206.

The image sensor chip 22 is glued at a bottom of the receiving cavity 203. A peripheral region of a top surface of the image sensor chip 22 is provided with a plurality of chip solder pads (not labeled).

The bonding wires 24 are made of conductive material such as gold or aluminum alloy. One end of each bonding wire 24 is connected to a respective top solder pad 204 of the substrate 20, and the other end of the bonding wire 24 is connected to a corresponding chip solder pad of the image sensor chip 22.

The adhesive means 26 is applied to cover the bonding wires 24, and areas where the bonding wires 24 connect with the top solder pads 204 and the chip solder pads. The adhesive means 26 may, for example, be a silicone, epoxy, acrylic, or polyamide adhesive. The adhesive means 26 provides a protective coating for the bonding wires 24, and reinforces the connections of the ends of the bonding wires 24 with the top solder pads 204 and the chip solder pads.

The cover 28 is a transparent plate member. The cover 28 is mounted on the substrate 20, thereby sealing the receiving cavity 203. An outer periphery of the cover 28 has a dimension smaller than that of the outer periphery of the substrate 20. Therefore, the substrate 20 has a top portion that is uncovered by the cover 28, which is hereinafter referred to as an adhesive applying section 29. The adhesive means 26 is applied to a peripheral portion of the cover 28 and the adhesive applying portion 29. Thereby, the cover 28 is securely fixed to the top side of the substrate 20, and the receiving cavity 103 is sealed. The image sensor chip 22 is thereby protected from external impact or contamination.

The lens barrel 30 is a hollow cylinder for receiving the at least one lens 31 therein. An outer periphery of the lens barrel 30 has a dimension equal to that of the outer periphery of the substrate 20. A lower portion of the lens barrel 30 has a stepped section having a first step portion 32 and a second step portion 34. An inner periphery of the first step portion 32 has a dimension slightly larger than that of the outer periphery of the cover 28. An inner periphery of the second step portion 34 has a dimension smaller than that of the outer periphery of the cover 28. The first and second step portions 32, 34 of the lens barrel 30 are respectively connected with the adhesive applying section 29 of the substrate 20 and with the outer periphery of a top portion of the cover 28, using the adhesive means 26.

In the preferred embodiments, it is of advantage that the top solder pads 204 are spaced a certain distance from the outer wall of the substrate 20. Therefore, when the adhesive means 26 is applied to cover the areas where the bonding wires 24 connect with the top solder pads 204, there is minimal risk of excess adhesive overflowing down along the outer wall of the substrate 20. In addition, it is also of advantage that the outer periphery of the cover 28 has a dimension slightly smaller than that of the outer periphery of the substrate 20. Therefore, the substrate 20 has the adhesive applying section 29 provided. Thus the adhesive means 26 may be applied in a corner region between the peripheral portion of the cover 28 and the adhesive applying section 29, thereby bonding the peripheral portion of the cover 28 to the adhesive applying section 29. Because the adhesive means 26 is applied in a corner region, it is easy to control the amount of the adhesive means 26 used. These benefits help prolong the reliability and useful working lifetime of the digital still camera module. Furthermore, the position of the lens barrel 30 is configured to be aligned with the substrate 20 of the image sensor package 2. Accordingly, it is relatively easy to ensure the lens 31 mounted in the lens barrel 30 is aligned with the center of the image sensor chip 22.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A digital still camera module comprising:
   an image sensor package comprising:
   a substrate comprising a board substrate and a frame substrate mounted on the board substrate, a top surface of the board substrate and an inner wall of the frame substrate cooperatively defining a receiving cavity therebetween;
   an image sensor chip mounted in the receiving cavity; and
   a transparent cover having a smaller profile than that of the substrate, the cover being secured to a top portion of the frame substrate thereby sealing the receiving cavity, the top portion of the frame substrate having an uncovered section at a periphery of the cover; and
   a lens barrel mounted on the image sensor package, the lens barrel comprising at least one lens received therein, the lens barrel being securely attached to the uncovered section of the top portion of the frame substrate and engaging the cover to precisely position the at least one lens relative to the image sensor chip.

2. The digital still camera module as claimed in claim 1, wherein the lens barrel has a stepped section at one side thereof, the stepped section surrounds the cover, and a top surface and a peripheral wall of the cover adhere to the stepped portion of the lens barrel.

3. The digital still camera module as claimed in claim 1, wherein an outer periphery of the lens barrel has a dimension equal to that of an outer periphery of the substrate.

4. The digital still camera module as claimed in claim 2, wherein the stepped section comprises a first step portion and a second step portion.

5. The digital still camera module as claimed in claim 4, wherein an inner periphery of the first step portion has a dimension larger than that of the outer periphery of the cover, and an inner periphery of the second step portion has a dimension slightly smaller than that of the outer periphery of the cover.

6. The digital still camera module as claimed in claim 5, wherein the first and second step portions of the lens barrel respectively adhere to the uncovered section of the top portion of the substrate and a top surface of the cover.

7. The digital still camera module as claimed in claim 2, wherein the substrate further comprises a plurality of top solder pads embedded in the top portion of the frame substrate and a plurality of bottom solder pads embedded in a bottom of the board substrate, each of the top solder pads electrically connecting with a corresponding one of the bottom solder pads.

8. The digital still camera module as claimed in claim 7, wherein an outer end of each top solder pad is spaced a distance from an outer wall of the substrate.

9. The digital still camera module as claimed in claim 7, wherein the substrate further comprises a plurality of vias defined therein, the vias being filled with conductive material to electrically interconnect the top solder pads with the bottom solder pads.

10. The digital still camera module as claimed in claim 9, wherein each via comprises a top via portion defined in the frame substrate, and a bottom via portion defined in the board substrate and communicating with the top via portion.

11. The digital still camera module as claimed in claim 7, wherein the image sensor chip comprises a plurality of solder pads arranged around a top surface thereof.

12. The digital still camera module as claimed in claim 11, wherein the substrate further comprises a plurality of bonding wires which respectively electrically connect the top solder pads of the substrate and the solder pads of the image sensor chip.

13. The digital still camera module as claimed in claim 12, wherein joint portions between the bonding wires and the top solder pads are covered with adhesive, and joint portions between the bonding wires and the solder pads of the image sensor chip are covered with adhesive.

14. The digital still camera module as claimed in claim 13, wherein the bonding wires are covered with adhesive.

15. A camera module comprising:
  an image sensor package comprising a substrate for accommodating an image sensor chip therein and comprising an opening at a side surface thereof to expose said image sensor chip, a cover of said image sensor package attachable to said side surface of said substrate so as to totally cover said opening and sized smaller than said side surface; and
  a lens barrel comprising at least one lens therein to transmit outside light of said camera module toward said image sensor chip, said lens barrel engagable with said cover and said side surface of said substrate at the same time so as to precisely position said at least one lens relative to said image sensor chip.

16. The camera module as claimed in claim 15, wherein said lens barrel comprises a first step portion and a second step portion formed at an end thereof, said first step portion adheres to said side surface of said substrate and said second step portion adheres to said cover.

17. A camera module comprising:
  an image sensor package comprising a substrate for accommodating an image sensor chip therein and comprising an opening at a side surface thereof to expose said image sensor chip, a cover of said image sensor package attachable to said side surface of said substrate so as to totally cover said opening and configured to have an occupied area against said side surface different from an area of said side surface; and
  a lens barrel comprising at least one lens therein to transmit outside light of said camera module toward said image sensor chip, said lens barrel engagable simultaneously with said cover and said side surface of said substrate via an end thereof so as to precisely position said at least one lens relative to said image sensor chip.

18. The camera module as claimed in claim 17, wherein said substrate comprising a board substrate and a frame substrate mounted on said board substrate, a top surface of said board substrate and an inner wall of said frame substrate cooperatively defining a receiving cavity therebetween so as to accommodate said image sensor chip therein.

19. The camera module as claimed in claim 15, wherein said substrate comprising a board substrate and a frame substrate mounted on said board substrate, a top surface of said board substrate and an inner wall of said frame substrate cooperatively defining a receiving cavity therebetween so as to accommodate said image sensor chip therein.

* * * * *